United States Patent [19]
Masui

[11] Patent Number: 5,852,538
[45] Date of Patent: Dec. 22, 1998

[54] POWER ELEMENT DRIVING CIRCUIT

[75] Inventor: Yoshitugu Masui, Kashihara, Japan

[73] Assignee: Sharp Kabushiki Kaisha, Osaka, Japan

[21] Appl. No.: 892,343

[22] Filed: Jul. 14, 1997

Related U.S. Application Data

[63] Continuation of Ser. No. 428,382, Apr. 25, 1995, abandoned.

[30] Foreign Application Priority Data

Apr. 27, 1994 [JP] Japan .................................. 6-089310

[51] Int. Cl.$^6$ ...................................................... H02H 7/00
[52] U.S. Cl. ................................................. 361/18; 361/93
[58] Field of Search ................................ 361/15, 54, 58, 361/86, 87, 93, 100, 101; 327/387–389; 250/551

[56] References Cited

U.S. PATENT DOCUMENTS

| 4,721,869 | 1/1988 | Okado ................................... 361/101 |
| 5,200,878 | 4/1993 | Sasagawa et al. ....................... 361/93 |
| 5,200,879 | 4/1993 | Sasagawa et al. ....................... 361/93 |
| 5,383,082 | 1/1995 | Nishizawa ............................... 361/93 |
| 5,485,341 | 1/1996 | Okado et al. ............................ 361/88 |

FOREIGN PATENT DOCUMENTS

| 0 467 681 A3 | 1/1992 | European Pat. Off. ....... H03K 17/08 |
| 0 467 682 A3 | 1/1992 | European Pat. Off. ....... H03K 17/08 |
| A-0467681 | 1/1992 | European Pat. Off. ....... H03K 17/08 |
| 0 599 455 A3 | 6/1994 | European Pat. Off. ......... H02H 3/08 |
| 4216177A1 | 11/1992 | Germany ........................ H03K 17/08 |

OTHER PUBLICATIONS

Miyazaki, et al.; "A Novel High Voltage Three–Phase Monolithic Inverter IC with Two Current levels of Sensing"; 3rd International Symposium on Power Semiconductor Devices and ICs; Apr. 22–24, 1991, pp. 248–253.

*Primary Examiner*—Ronald W. Leja
*Attorney, Agent, or Firm*—David G. Conlin; Christine C. O'Day; Dike, Bronstein, Roberts & Cushman, LLP

[57] ABSTRACT

A power element driving circuit is provided with an abnormality detecting circuit which detects an occurrence of abnormality in an IGBT (power element) or a short-circuit load based on a collector voltage of the IGBT, and controls a gate voltage control circuit so as to gradually reduce a gate voltage of the IGBT. According to the described arrangement, the IGBT can be protected from breakdown caused by short-circuit current increased by itself due to an inverse current from the load. Moreover, since an occurrence of abnormality in the IGBT is detected after starting up the IGBT, the rise time for the IGBT can be reduced, thereby preventing the thermal breakdown or power loss which may occur when a long rise time is required.

22 Claims, 5 Drawing Sheets

SIGNAL FROM ABNORMALITY DETECTING CIRCUIT

FIG. 6
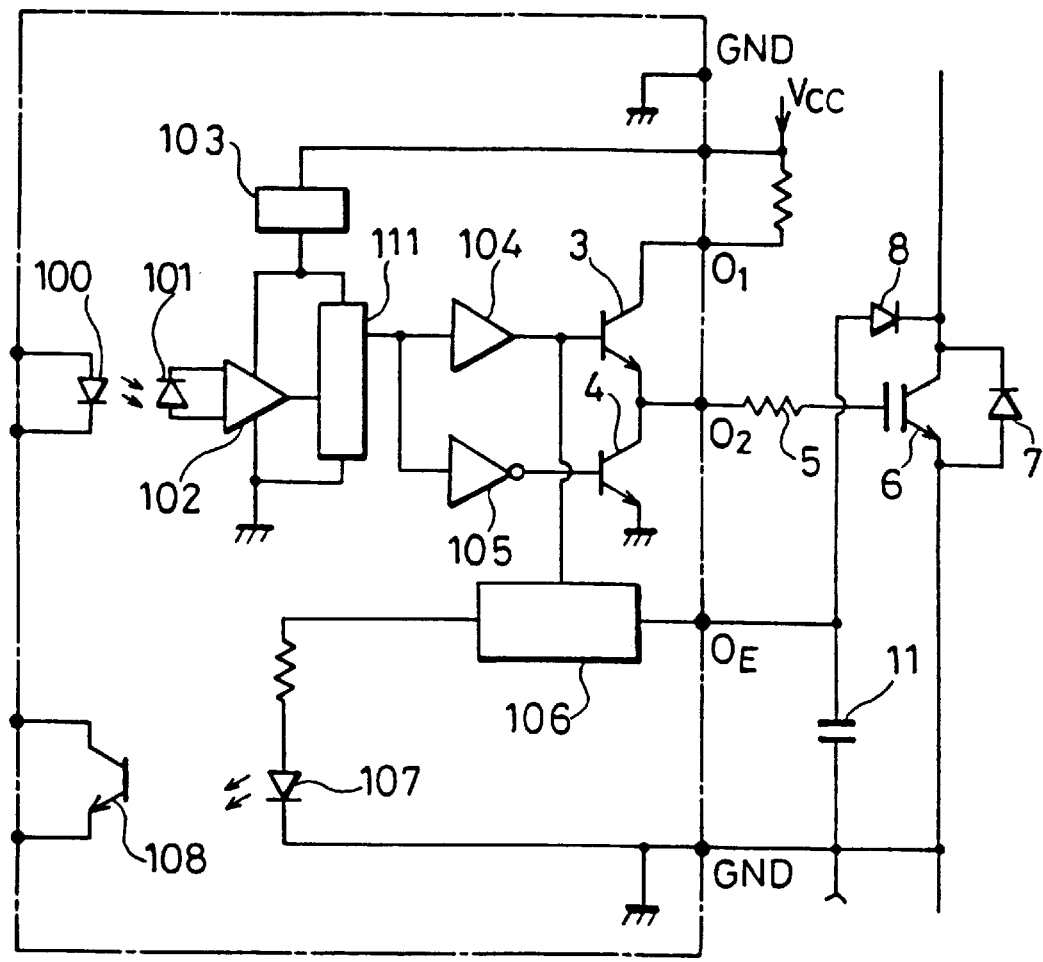
FIG. 7
FIG. 8
PRIOR ART
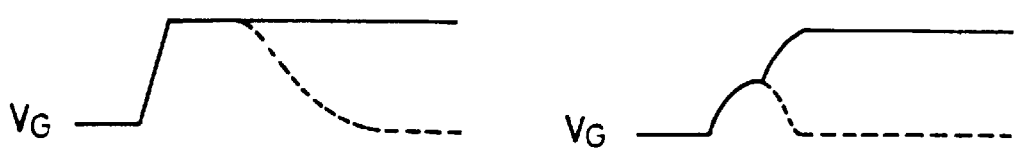

POWER ELEMENT DRIVING CIRCUIT

This is a File Wrapper continuation of application Ser. No. 08/428,382 filed on Apr. 25, 1995 now abandoned.

FIELD OF THE INVENTION

The present invention relates to a power element driving circuit for driving a power element for an inverter for use in controlling variable speed of an AC motor.

BACKGROUND OF THE INVENTION

An inverter is applied to a variety of fields for controlling variable speed of an AC motor, mainly for voltage controlled V/F (Variable/Frequency) control. The variable speed control of this type is performed by regularly switching a load of the AC motor, etc., by the inverter.

As a power element for the inverter, IGBT (Insulated Gate Bipolar Transistor), MOSFET, a power transistor, etc., have been used. Among the above-listed power elements, the IGBT and the MOSFET are the power elements of voltage driving type, and have extremely high input impedances of the gate.

For example, when the IGBT is adopted as the power element, when a short-circuit load occurs, a large current flows according to its current-voltage characteristic. Additionally, the IGBT has a smaller chip area compared with the power transistor and the MOSFET, which results in a smaller thermal capacity, thereby presenting the problem that the IGBT may breakdown. Therefore, in order to protect the IGBT from breakdown, it is required to detect an occurrence of abnormality at an earliest possible stage when the short-circuit load occurs and lower the gate voltage.

As a conventional IGBT protection method, a method for activating the IGBT at two stages is known. In this method, as shown in FIG. 8, when activating (switching on) the IGBT, first, the IGBT starts up at low gate voltage $V_G$ to limit the short-circuit current. At this stage, if it is confirmed that abnormality has not occurred, the gate voltage $V_G$ is raised to a normal level as shown by the solid line. On the other hand, if it is determined that abnormality has occurred, the gate voltage $V_G$ is lowered to turn off the IGBT as shown by the short dashed line without raising the gate voltage $V_G$ to the normal level.

Normally, the time required for switching the gate voltage of the IGBT is not more than 0.1 $\mu$s. However, when adopting the described IGBT protection method, considering the time required for detecting an occurrence of abnormality, at least around 5–10 $\mu$s is required for switching the gate voltage of the IGBT. Additionally, the mentioned time period is always required irrespectively of whether or not abnormality has occurred in the IGBT.

When a long switching time is required as in the described case, the problem of breakdown of the IGBT due to a small thermal capacity or larger power loss may occur.

SUMMARY OF THE INVENTION

An object of the present invention is to provide a power element driving circuit which permits a shorter rise time of a voltage to be applied to a control electrode (gate) of the power element without damaging a protection function.

In order to achieve the above object, the power element driving circuit in accordance with the present invention includes:

driving means for driving a power element;

control means for controlling the driving means;

abnormality detection means for detecting an occurrence of abnormality in the power element or a load connected to the power element; and voltage drop control means for controlling the control means so as to gradually lower a driving voltage of the power element when the occurrence of abnormality in the power element or the load connected to the power element is detected by the abnormality detection means.

In the power element driving circuit having the described arrangement, an occurrence of a short-circuit load or abnormality in the power element is detected by the abnormality detection means. Upon detecting the occurrence of the described abnormality, the control means controls the driving means for reducing a driving voltage of the power element under the control of the voltage drop control means, thereby gradually reducing the driving voltage.

In the case where the IGBT is adopted as the power element, as the IGBT increases the short-circuit current by an inverse current from the load when the gate voltage suddenly drops, the IGBT may break down. Therefore, according to the arrangement of the present invention, as the driving voltage is gradually lowered, the power element can be protected from breakdown.

Additionally, since the abnormality detecting circuit detects an occurrence of abnormality after a pulse of the power element is raised up once, compared with the conventional method of raising the pulse at two stages, the rise time can be reduced. As a result, the breakdown or increasing power loss due to a small thermal capacity of the power element can be prevented.

It is preferable that the power element driving circuit of the present invention further includes holding means for holding the driving voltage reducing operation even when an external signal for switching the power element OFF is inputted in a process of lowering the driving voltage by the voltage drop control means.

According to the above-mentioned arrangement, even when a signal for switching the power element OFF is inputted (including the case where the signal for switching the power element on is shut out), the driving voltage reducing operation is continued by the holding means, thereby preventing a sudden drop in driving voltage of the power element. As a result, the power element can be protected from breakdown due to a sudden drop in driving voltage.

For a fuller understanding of the nature and advantages of the invention, reference should be made to the ensuing detailed description taken in conjunction with the accompanying drawings.

BRIEF DESCRIPTION OF THE DRAWINGS

FIG. 6 is a circuit diagram showing a structure of an optically coupled element wherein a power element driving circuit is integrated.

FIG. 7 is a wave form chart showing respective wave forms of a gate voltage in a normal condition and in an abnormal condition, which is be applied to an IGBT by the power element driving circuit of FIG. 1.

FIG. 8 is a wave form chart showing respective wave forms of a gate voltage under a normal condition and an abnormal condition, which is to be applied to an IGBT by a conventional power element driving circuit.

DESCRIPTION OF THE EMBODIMENTS

The following descriptions will discuss one embodiment of the present invention in reference to FIG. 1 through FIG. 7.

Figure 1:
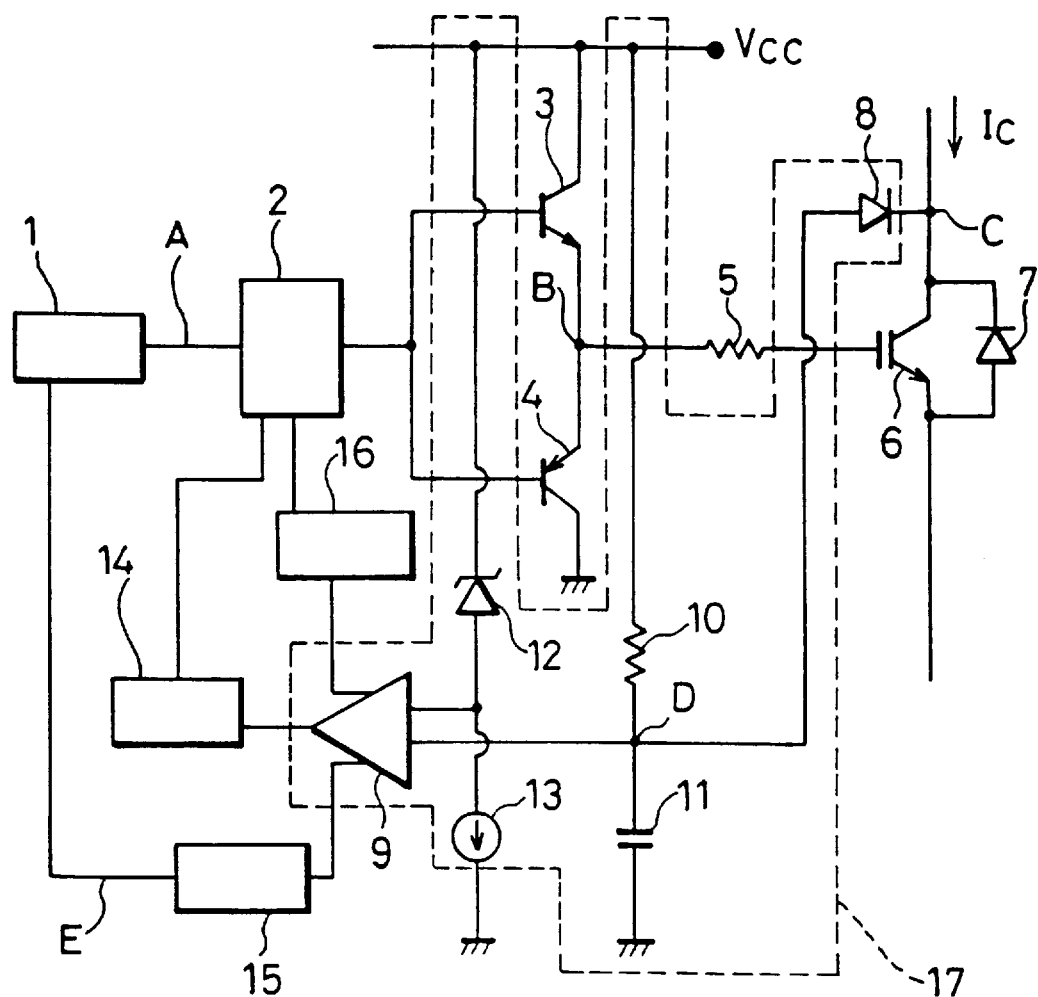
FIG. 1 is a circuit diagram showing a structure of an essential part of a power element driving circuit in accordance with one embodiment of the present invention.

As illustrated in FIG. 1, in a power element driving circuit in accordance with the present embodiment, a signal input section 1 is connected to a gate voltage control circuit 2. The gate voltage control circuit 2 is connected to a common base connection of a driving circuit wherein an n-p-n transistor 3 and a p-n-p transistor 4 are complementary connected in series. A common emitter connection between the n-p-n transistor 3 and the p-n-p transistor 4 is connected to a gate of an IGBT 6 as a power element through a resistor 5.

A withstand high voltage diode 7 is connected across a collector and an emitter of the IGBT 6. The collector of the IGBT 6 is connected to an abnormality detecting circuit 9 through a withstand high voltage diode 8. A resistor 10 is provided between an anode of the withstand high voltage diode 8 and a power supply (voltage Vcc), and a condenser 11 is provided between the anode and ground.

A Zenner diode 12 and a constant current circuit 13 are connected in series across the power supply and ground, and an input terminal of the abnormality detecting circuit 9 is connected to the connection between the Zenner diode 12 and the constant current circuit 13. Output terminals of the abnormality detecting circuit 9 is connected to the following three elements: the gate voltage control circuit 2 through a holding circuit 14; the signal input section 1 through an abnormal signal output circuit 15; and the gate voltage control circuit 2 through the gate voltage control circuit 16 upon detecting an occurrence of abnormality (hereinafter simply referred to as a gate voltage control circuit).

The holding circuit 14 is provided for preventing a protecting operation initiated upon detecting the occurrence of abnormality from suddenly stopping by cancelling the abnormality immediately after the protecting operation is started. Namely, once the protecting operation is started, the holding circuit 14 holds the protecting operation until it is completed. The abnormal signal output circuit 15 feedbacks the detection of abnormality by the abnormality detecting circuit 9 to an external section through the signal input section 1.

A detecting section 17 is composed of the withstand high voltage diode 8, the abnormality detecting circuit 9, the resistor 10, the condenser 11, the Zenner diode 12 and the constant current circuit 13 which are in the square marked by the short-dashed line in FIG. 1. The detecting section 17 is provided with a function for detecting a collector voltage and a function for setting a detection level.

The operation of the power element driving circuit having the described arrangement will be described below.

First, abnormality detecting operations based on a collector voltage of the IGBT 6 will be explained below.

As described, the collector of the IGBT 6 is connected to the abnormality detecting circuit 9 through the withstand high voltage diode 8. The abnormality detecting circuit 9 is a comparator circuit, and an output from the abnormality detecting circuit 9 varies depending on a condition of a collector voltage of the IGBT 6 and a detection level ($V_{CC}-V_{ZD}$: $V_{ZD}$ indicates a Zenner voltage of the Zenner diode 12).

The abnormality detection level is set based on an emitter potential of the IGBT 6. In other words, the abnormality detection level is set based on $V_{CC}$ value irrespectively of a level of an inverse bias voltage of the IGBT 6. Alternatively the abnormal detection level may be set using ground or an externally generated potential independently of the internal potential as a reference.

The respective operations of the case where abnormality has occurred in the IGBT 6 and the case where the abnormality has not occurred in the IGBT 6 will be explained.

In order to activate the IGBT 6, an ON control signal is inputted to the signal input section 1. As a result, as shown in FIG. 7, the gate voltage $V_G$ is instantaneously switched to the HIGH level shown by the solid line indicating a rise. In this state, if abnormality has not occurred neither in the load (the load of the IGBT 6) not shown, nor the IGBT 6, the collector voltage of the IGBT 6 is lowered to around 2–5 volts, thereby inputting a signal of a LOW level to the abnormality detecting circuit 9 through the withstand high voltage diode 8 which detects a collector voltage. By the signal of the LOW level inputted to the abnormality detecting circuit 9, the holding circuit 14, the abnormal signal output circuit 15 and the gate voltage control circuit 16 will not be activated.

In the state where abnormality has not occurred neither in the load nor the IGBT 6, and an input signal is not inputted, since it is not needed to protect the IGBT 6, the holding circuit 14, the abnormality signal output circuit 15 and the gate voltage control circuit 16 will not be activated by the input signal from the signal input section 1.

On the other hand, in the state where abnormality has occurred in the load or the IGBT 6, and an ON control signal is inputted, when the collector voltage of the IGBT 6 is switched to the HIGH level, a signal of a HIGH level is inputted to the abnormality detecting circuit 9. By the input signal, the holding circuit 14, the abnormal signal output circuit 15 and the gate voltage control circuit 16 are activated, and the gate voltage of the IGBT 6 is gradually lowered as shown by the short dashed line in FIG. 7, thereby protecting the IGBT 6 from breakdown due to short-circuit current increased by itself by an inverse current from the load.

The described gate voltage reducing operation will be explained in more detail in reference to FIG. 2. For convenience in the explanations, only the components related to the gate voltage control circuit 16 are shown in the figure.

Figure 2:
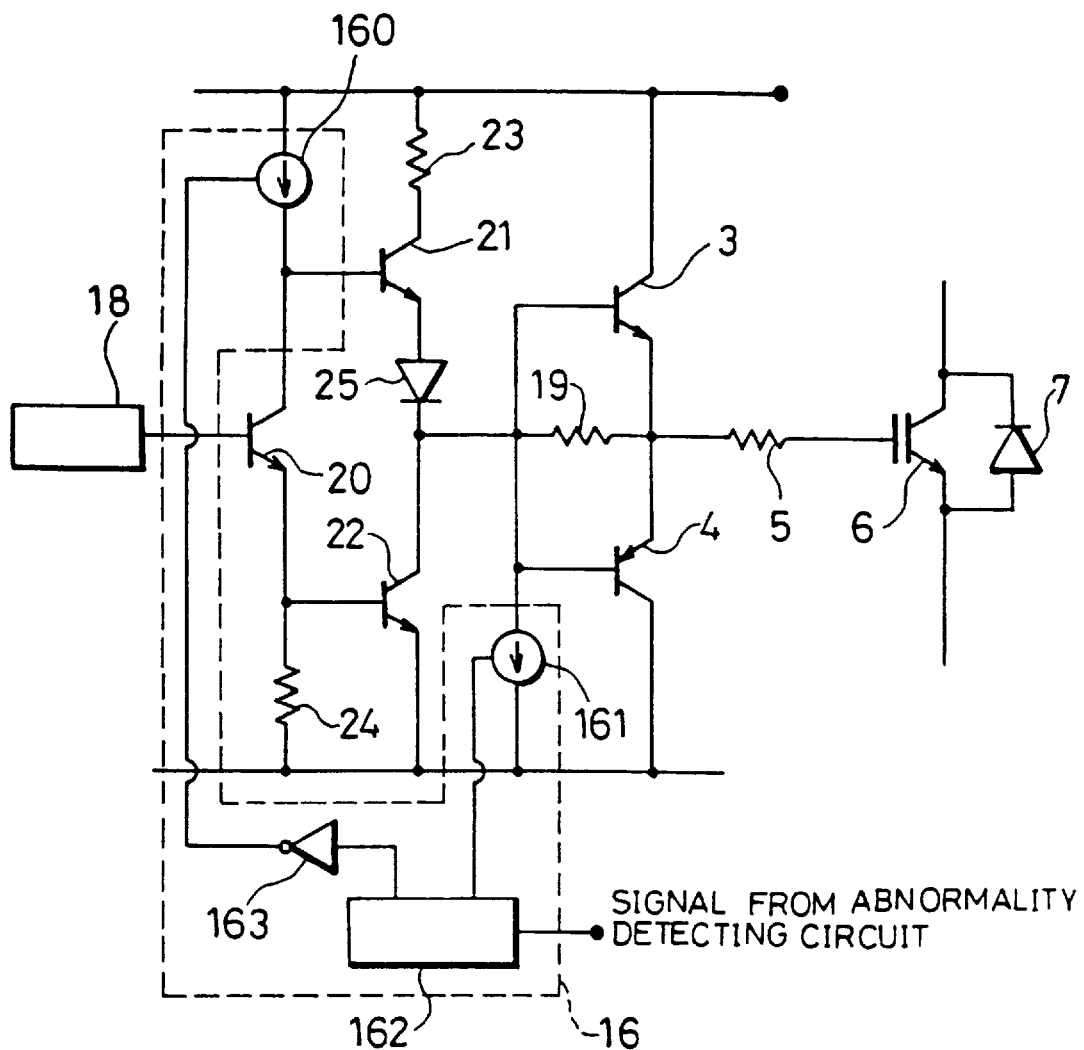
FIG. 2 is a circuit diagram showing a structure of a gate voltage control circuit upon detecting an occurrence of abnormality in the power element driving circuit of FIG. 1.

As illustrated in FIG. 2, the gate voltage control circuit 16 which serves as the voltage drop control means is composed of constant current circuits 160·161, a constant current switching circuit 162 and a NOT circuit 163 which are in the square marked by the short-dashed line. The constant current switching circuit 162 for controlling ON/OFF of the constant current circuits 160·161 includes the aforementioned abnormality detecting circuit 9. To the constant current switching circuit 162, a collector voltage is inputted from the point D shown in FIG. 1.

In FIG. 2, an interface 18 corresponding to the signal input section 1 (see FIG. 1) is connected to a base of an n-p-n transistor 20. A resistor 23 is connected to a collector of an n-p-n transistor 21, and a resistor 24 is connected across a base and an emitter of a n-p-n transistor 22. Further, a diode 25 is connected across an emitter of the p-n-p transistor 21 and a collector of the p-n-p transistor 22. The aforementioned gate voltage control circuit 2 is composed of the n-p-n transistors 20 through 22, the resistors 23 and 24 and the diode 25.

Whether or not abnormality has occurred in the IGBT 6 or in the load is detected by the abnormality detecting circuit 9 based on the collector voltage of the IGBT 6 detected through the withstand high voltage diode 8. Upon detecting an occurrence of abnormality, the following operations will be executed by a constant current switching circuit 162.

In the state where the n-p-n transistors 20 and 21 are respectively switched ON and switched OFF and the n-p-n transistor 22 is switched ON, the p-n-p transistor 4 is switched ON which causes a sudden drop in gate voltage. According to the arrangement of the present embodiment, the constant current circuit 160 is switched OFF and the constant current circuit 161 is switched ON in the state where the n-p-n transistor 20 is switched OFF. Then, the base current of the p-n-p transistor 4 is pulled in the constant current circuit 161, and the gate voltage is gradually lowered.

The reducing speed of the gate voltage can be altered as desired by setting the current value of the constant current circuit 161. Alternatively, a resistor may be used in replace of the constant current circuit 161. In the case of adopting the resistor, the reducing speed of the gate voltage can be altered by changing the resistance.

In FIG. 2, a resistor 19 is provided between a connection (the point B) between the emitters of the n-p-n transistor 3 and the p-n-p transistor 4 and a connection between the bases of the transistors 3 and 4. The resistor 19 is provided for preventing the switching of the p-n-p transistor 4.

Figure 3:
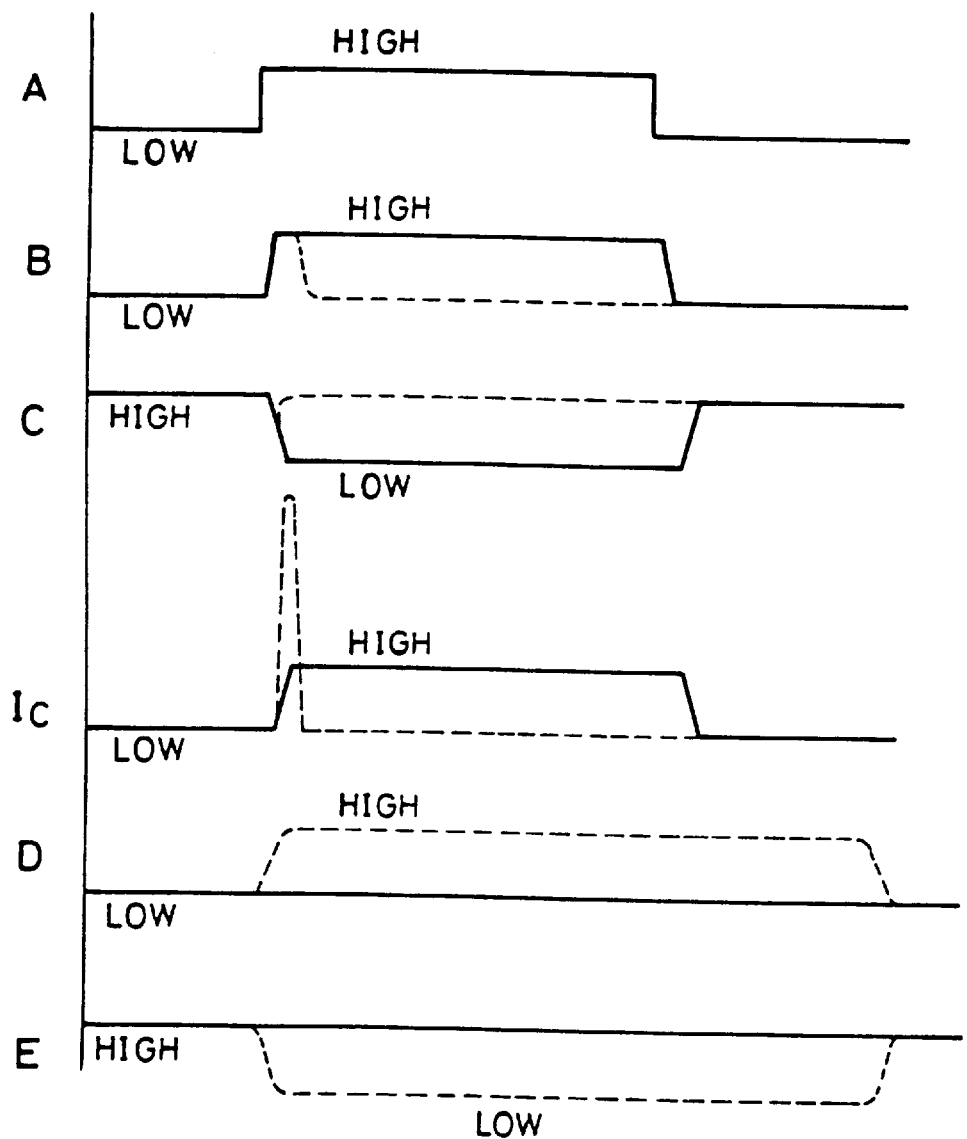
FIG. 3 is a wave form chart showing a wave form of a single in each section of the power element driving circuit of FIG. 1.

FIG. 3 shows a wave form of a signal in each section of the power element driving circuit of FIG. 1.

In the normal state, as shown by the solid line in FIG. 3, when a signal is inputted from the signal input section 1, the input signal is switched from the LOW level to the HIGH level at the point A. Then, the gate voltage control circuit 2 switches the n-p-n transistor 3 ON, and a voltage at the point B is switched to the HIGH level. As a result, the IGBT 6 is switched ON, and the collector current $I_C$ flows thereto, thereby switching the voltage to the HIGH level at the point C. In this state, as the abnormality is not detected by the abnormality detecting circuit 9, the voltage at point D remains in the LOW level, and the voltage at the point E (output from the abnormal signal output circuit 15) remains in the HIGH level.

When a short-circuit load or an abnormal condition of IGBT 6 has occurred, as shown by the short dashed line in FIG. 3, the collector current $I_C$ of the IGBT 6 increases, and the collector voltage at the point C is increased. As a result, the voltage at the point D is switched to the HIGH level, and the protection function for the IGBT 6 is operated by the abnormality detecting circuit 9, thereby switching the voltage at the point B and the voltage at the point E to the LOW level.

In the circuits shown in FIGS. 1 and 2, while the gate voltage is being lowered due to abnormality occurred in the IGBT 6, for example, as an input light is cut-off, when a signal for switching OFF the gate voltage is inputted from the external section, the gate voltage may be suddenly switched OFF. In this case, as described earlier, breakdown of the IGBT 6 may occur due to an increased short-circuit by an inverse current from the load.

Figure 4:
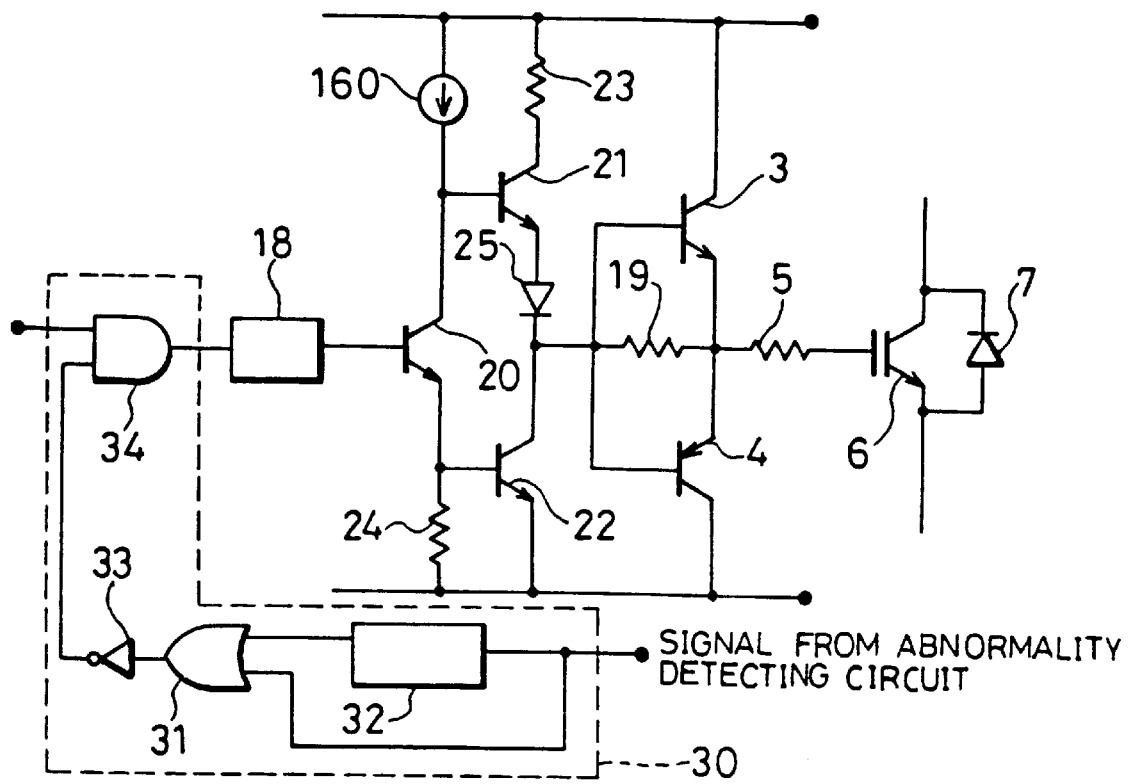
FIG. 4 is a circuit diagram showing a structure of a protecting operation holding circuit for holding a protecting operation in the power element driving circuit of FIG. 1.

The described problem can be solved by adopting the circuit having the arrangement illustrated in FIG. 4. The circuit is a protecting operation holding circuit 30 composed of an OR circuit 31, a delay circuit 32, a NOT circuit 33 and an AND circuit 34 which are shown in the square marked by the short dashed line in the FIG. 4. In the figure, only the components related to the protecting operation holding circuit 30 are shown as in the previous case.

In the protecting operation holding circuit 30 which serves as the holding means, a signal from the abnormality detecting circuit 9 is inputted to the OR circuit 31 directly and through the delay circuit 32. An output from the OR circuit 31 is inputted to one of the input terminals of the AND circuit 34 through the NOT circuit 33. Additionally, an input signal is inputted to the other input terminal of the AND circuit 34.

In the protecting operation holding circuit 30 having the described arrangement, when a signal is outputted from the abnormality detecting circuit 9 of FIG. 1, during the time period in the delay circuit 32, as a signal is not inputted to the AND circuit 34 from the NOT circuit 33, an input signal is not outputted to the interface 18, thereby holding an output irrespectively of whether or not a signal is inputted.

Figure 5:
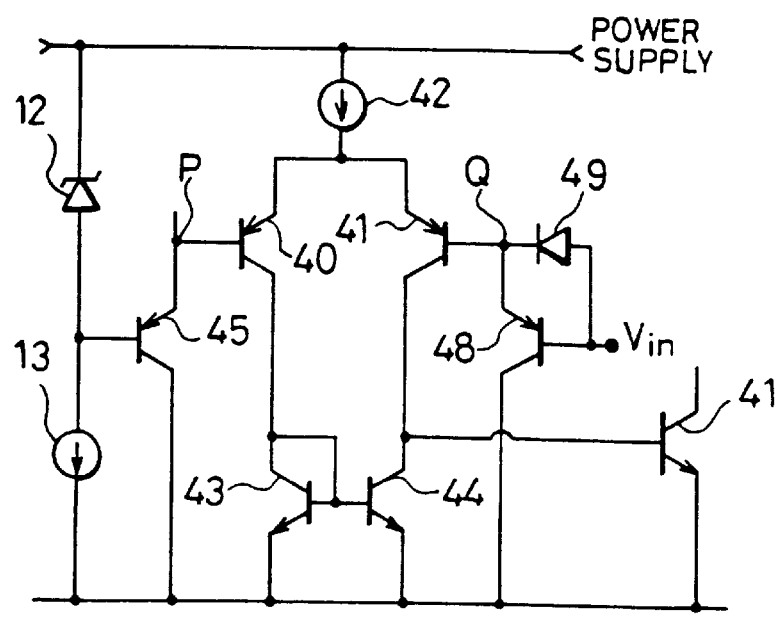
FIG. 5 is a circuit diagram showing a structure of an abnormality detecting circuit in the power element driving circuit of FIG. 1.

As illustrated in FIG. 5, the abnormality detecting circuit 9 includes p-n-p transistors 40 and 41 whose emitters are connected and a constant current circuit 42 connected across the emitter and the power supply. The collectors of the p-n-p transistors 40 and 41 are respectively connected to the collectors of n-p-n transistors 43 and 44. The base of the n-p-n transistor 43 and the base of the n-p-n transistor 44 are connected. Furthermore, the base and the emitter of the n-p-n transistor 43 are short-circuited. The base of the p-n-p transistor 40 is connected to the emitter of a p-n-p transistor 45. A Zenner diode 12 is connected across the base of the p-n-p transistor 45 and the power supply, and a constant current circuit 13 is provided so as to be branched from the base.

On the other hand, the base of the p-n-p transistor 41 is connected to an emitter of the p-n-p transistor 48, and a diode 49 is connected across the base and the emitter of the p-n-p transistor 48. The base of the p-n-p transistor 48 serves as an input terminal for inputting thereto an abnormality detecting voltage.

In the circuit having the described arrangement, the reference voltage to be applied to the comparator is set by the Zenner diode 12 and the constant current circuit 13. The reference voltage is set to a voltage obtained by extracting the Zenner voltage of the Zenner diode 12 from the voltage of the power supply.

When the input terminal is switched from the LOW level to the HIGH level, a voltage at the point Q will be: $V_{in}-V_F$ ($V_{in}$ is an input voltage to be applied to the input terminal, and $V_F$ is a forward voltage of the diode 49). On the contrary, when the input terminal is switched from the HIGH level to the LOW level, a voltage at the point Q will be: $V_{in}+V_{BE}$ ($V_{BE}$ is a base-emitter voltage of the p-n-p transistor 48).

Therefore, from the side of the input terminal, the voltage at the point Q is: $V_{in}+V_{BE}=0.7$ (V)+0.7 (V)=1.4 (V), and the hysteresis of 1.4 (V) is obtained.

Namely, only by connecting the diode 49 across the emitter and the base of the p-n-p transistor 48 in the generally used comparator, the hysteresis can be easily provided in response to a signal inputted to the comparator.

Next, the arrangement where the power element driving circuit is incorporated into an optically coupled element will be explained.

As illustrated in FIG. 6, the optically coupled element includes an anode terminal and a cathode terminal of a light emitting diode 100 on the primary side, and includes a power supply terminal $V_{CC}$, a ground terminal GND, an input terminal $O_1$ connected to the collector of the n-p-n transistor 3, and an output terminal $O_2$ connected to the base of the IGBT 6 on the secondary side and an abnormality detecting input terminal $O_E$.

The optically coupled element includes a photo diode 101 for receiving light from the light emitting diode 100 in a vicinity of the light emitting diode 100, and an amplifier 102 for amplifying an output from the photo diode 101. A constant voltage generated in the constant voltage circuit 103 is applied to the amplifier 102 and to the input circuit 111 which is a part of the signal input section 1 (see FIG. 1). Then, the output from the input circuit 111 is applied to the n-p-n transistor 3 and the p-n-p transistor 4 respectively through the logic elements 104 and 105.

To the connection between the output terminal of the logic element 104 and the base of the n-p-n transistor 3, a protection circuit 106 is connected. The protection circuit 106 includes the gate voltage control circuit 2, the detecting section 17 (excluding the withstand high voltage diode 8 and the condenser 11), the holding circuit 14, the error detecting circuit 15 and the gate voltage control circuit 16 (see FIG. 1), etc. The protection circuit 106 is provided for protecting the IGBT 6. A light emitting diode 107 is connected across the output terminal of the protection circuit 106 and a ground terminal GND. Further, a photo transistor 108 is provided for receiving light from the light emitting diode 107.

In the optically coupled element having the described arrangement, an abnormality detecting signal outputted on the secondary side, i.e., the side of the driving section for the IGBT 6 is fed back to the primary side by the light emitting diode 107 and the photo transistor 108.

As described, by forming the optically coupled element provided with the function for protecting the IGBT 6 on a single chip, a significant reduction in the size of the circuit can be achieved compared with the conventional IPM (Intelligent Power Module), etc., wherein such circuit is composed of discrete elements. As a note, the IPM is an IC composed of a switching power element, a driving circuit for driving the switching power element, a protection circuit for protecting the switching power element, etc., which are integrated to form a module. The IPM is also referred to as a "power IC".

According to the described arrangement, since each component is formed on a single chip, variations in the properties among the components can be suppressed, and an improved noise resistance can be achieved, compared with the IPM composed of discrete elements. Furthermore, when the optically coupled element is applied to a generally used inverter, the number of components can be significantly reduced. Additionally, a significant cost reduction can be achieved, from several thousands yen/each to several tens yen/each compared with the conventional IPM.

In the optically coupled element, the output from the protection circuit 106 is fed back to the primary side inside the element. However, it may be arranged so as to be outputted as an abnormality detecting signal to the secondary side.

In order to prevent the problem of higher threshold level of the optically coupled element which may occur in the state where a light amount is reduced due to the deterioration of the light emitting diode 100 on the primary side, a warning function may be provided, for informing that the light emitting diode 100 cannot maintain the normal level by monitoring the light amount of the light emitting diode 100. Alternatively, when the light emitting diode 100 deteriorates, a function for increasing a forward current of the light emitting diode 100 may be provided for preventing a higher threshold level of the optically coupled element.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power element driving circuit comprising:

driving means for driving a power element, said driving means includes a circuit having an n-p-n transistor and a p-n-p transistor which are complementary connected in series, and a control electrode of said power element connected to an emitter of said n-p-n transistor and to an emitter of said p-n-p transistor, the emitter of said n-p-n transistor and the emitter of said p-n-p transistor being connected, said driving means providing a driving voltage to said power element, said driving voltage being the only signal provided to said control electrode of said power element;

control means for controlling said driving means, said control means being configured to send a control signal to a base of said n-p-n transistor and to a base of said p-n-p transistor, the base of said n-p-n transistor and the base of said p-n-p transistor being connected, said control signal controlling delivery of said driving voltage to said control electrode of said power element;

abnormality detection means for detecting an occurrence of abnormality in said power element or a load connected to said power element; and voltage drop control means for controlling said control means so as to gradually lower said driving voltage of said power element when the occurrence of abnormality in said power element or the load connected to said power element is detected by said abnormality detection means.

2. The power element driving circuit as set forth in claim 1, wherein said voltage drop control means includes:

a constant current circuit for pulling in a base current from said p-n-p transistor; and a switching circuit for stopping an operation by said control means and activating said constant current circuit based on an abnormality detecting signal from said abnormality detection means.

3. A power element driving circuit as set forth in claim 2, further comprising:

a second constant current circuit for outputting a constant current, wherein the control means includes a first transistor for supplying a base current to said n-p-n transistor and said p-n-p transistor, a second transistor for pulling in a base current from said n-p-n transistor and said p-n-p transistor, and a third transistor for controlling operations of the first and second transistor by supplying a constant current from the second constant current circuit according to an input signal, and the switching circuit stops an operation of the control means by stopping an operation of the second constant current circuit based on the abnormality detection signal from the abnormality detection means.

4. The power element driving circuit as set forth in claim 1, further comprising:

holding means for effecting gradual lowering of the driving voltage even when a signal for switching said power element OFF is inputted thereto in a process of lowering the driving voltage by said voltage drop control means.

5. The power element driving circuit as set forth in claim 4, wherein said holding means includes:

a delay circuit for delaying an abnormality detecting signal inputted from said abnormality detection means for a predetermined time;

an OR circuit for outputting a logical sum of the abnormality detecting signal inputted from said abnormality detection means and an abnormality detecting signal passed through said delay circuit;

a NOT circuit for inverting an output from said OR circuit; and an AND circuit for outputting a logical product of an output from said NOT circuit and an external signal for switching said power element ON/OFF.

6. The power element driving circuit as set forth in claim 1, wherein:

said abnormality detection means includes a comparator circuit for detecting an occurrence of abnormality in said power element or the load by comparing a voltage of an electrode for flowing thereto a load current with a reference voltage, the electrode being one of electrodes of said power element.

7. The power element driving circuit as set forth in claim 6, wherein:

said comparator circuit has a hysteresis characteristic in response to said voltage of said electrode inputted thereto.

8. The power element driving circuit as set forth in claim 7, wherein:

said comparator circuit includes a transistor for inputting thereto said voltage to be compared with the reference voltage, wherein a diode is connected across an emitter and a base of said transistor.

9. A power element driving circuit comprising:

driving means for driving an insulated gate bipolar transistor, said driving means includes a circuit wherein a n-p-n and a p-n-p transistor are complementary connected in series, and a gate of said insulated gate bipolar transistor is connected to an emitter of said n-p-n transistor and to an emitter of said p-n-p transistor, the emitter of said n-p-n transistor and the emitter of said p-n-p transistor being connected, said driving means providing a driving voltage to said insulated gate bipolar transistor, said driving voltage being the only signal provided to said gate of said insulated gate bipolar transistor;

control means for controlling said driving means, said control means being configured to output a control signal to a base of said n-p-n transistor and to a base of said p-n-p transistor, the base of said n-p-n transistor and said p-n-p transistor being connected, said control signal controlling delivery of said driving voltage to said gate of said insulated gate bipolar transistor;

abnormality detection means for detecting an occurrence of abnormality in said insulated gate bipolar transistor or in a load connected to said insulated gate bipolar transistor; and voltage drop control means for controlling said control means to gradually lower said driving voltage of said insulated gate bipolar transistor when the occurrence of abnormality in said insulated gate bipolar transistor or the load is detected by said abnormality detection means.

10. The power element driving circuit as set forth in claim 9 wherein said voltage drop control means includes:

constant current circuit for pulling in a base current of said p-n-p transistor; and a switching circuit for stopping an operation from said control means while acting said constant current circuit based on an abnormality detecting signal from said abnormality detection means.

11. A power element driving circuit as set forth in claim 10, further comprising:

a second constant current circuit for outputting a constant current, wherein the control means includes a first transistor for supplying a base current to said n-p-n transistor and said p-n-p transistor, a second transistor for pulling in a base current from said n-p-n transistor and said p-n-p transistor, and a third transistor for controlling operations of the first and second transistor by supplying a constant current from the second constant current circuit according to an input signal, and the switching circuit stops an operation of the control means by stopping an operation of the second constant current circuit based on the abnormality detection signal from the abnormality detection means.

12. The power element driving circuit as set forth in claim 9, further comprising:

holding means for effecting gradual lowering of the drive voltage even when a signal for switching said insulated gate bipolar transistor OFF is inputted thereto in a process of lowering the driving voltage by said voltage drop control means.

13. The power element driving circuit as set forth in claim 12, wherein said holding means includes:

a delay circuit for delaying the abnormality detecting signal inputted from said abnormality detection means for a predetermined time;

an OR circuit for outputting a logical sum of the abnormality detecting signal outputted from said abnormality detection means and an abnormality detecting signal passed through said delay circuit;

a NOT circuit for inverting an output from said OR circuit; and an AND circuit for outputting a logical product of an output from said NOT circuit and an external signal for switching said insulated gate bipolar transistor ON/OFF.

14. The power element driving circuit as set forth in claim 9, wherein:

said abnormality detection means includes a comparator circuit for detecting an occurrence of abnormality in said insulated gate bipolar transistor or the load by comparing a collector voltage of said insulated gate bipolar transistor with a reference voltage.

15. The power element driving circuit as set forth in claim 14, wherein:

said comparator circuit has a hysteresis characteristic in response to said collecter voltage inputted thereto.

16. The power element driving circuit as set forth in claim 15, wherein:
said comparator circuit includes a transistor for inputting thereto the collector voltage, wherein a diode is connected across an emitter and a base of said transistor.

17. A optically coupled element being an integrated circuit, comprising:
a light emitting element;
a light receiving element for receiving light emitted from said light emitting element;
driving means for driving a power element, said driving means includes a circuit having an n-p-n transistor and a p-n-p transistor which are complementary connected in series, and a control electrode of said power element connected to an emitter of said n-p-n transistor and to an emitter of said p-n-p transistor, the emitter of said n-p-n transistor and the emitter of said p-n-p transistor being connected, said driving means providing a driving voltage to said power element, said driving voltage being the only signal provided to said control electrode of said power element;
control means for controlling said driving means based on an output from said light receiving element, said control means being configured to send a control signal to a base of said n-p-n transistor and to a base of said p-n-p transistor, the base of said n-p-n transistor and the base of said p-n-p transistor being connected, said control signal controlling delivery of said driving voltage to said control electrode of said power element;
abnormality detection means for detecting an occurrence of abnormality in said power element or a load connected to said power element; and
voltage drop control means for controlling said control means so as to gradually lower said driving voltage of said power element when the occurrence of abnormality in said power element or the load is detected by said abnormality detection means,
wherein said light emitting element, said light receiving element, said driving means, said control means, said abnormality detection means and said voltage drop control means are formed on a single chip.

18. A optically coupled element being an integrated circuit, comprising:
a light emitting element;
a light receiving element for receiving light emitted from said light emitting element;
driving means for driving an insulated gate bipolar transistor, said driving means includes a circuit wherein a n-p-n and a p-n-p transistor are complementary connected in series, and a gate of said insulated gate bipolar transistor is connected to an emitter of said n-p-n transistor and to an emitter of said p-n-p transistor, the emitter of said n-p-n transistor and the emitter of said p-n-p transistor being connected, said driving means providing a driving voltage to said insulated gate bipolar transistor, said driving voltage being the only signal provided to said gate of said insulated gate bipolar transistor;
control means for controlling said driving means based on an output from said light receiving element, said control means being configured to output a control signal to a base of said n-p-n transistor and to a base of said p-n-p transistor, the base of said n-p-n transistor and said p-n-p transistor being connected, said control signal controlling delivery of said driving voltage to said gate of said insulated gate bipolar transistor;
abnormality detection means for detecting an occurrence of abnormality in said insulated gate bipolar transistor or a load connected to said insulated gate bipolar transistor; and
voltage drop control means for controlling said control means so as to gradually lower said driving voltage of said insulated gate bipolar transistor when the occurrence of abnormality in said insulated gate bipolar transistor or the load is detected by said abnormality detection means,
wherein said light emitting element, said light receiving element, said driving means, said control means, said abnormality detection means and said voltage drop control means are formed on a single chip.

19. A power element driving circuit comprising:
driving means for driving a power element, said driving means includes a circuit having an n-p-n transistor and a p-n-p transistor which are complementary connected in series, and a control electrode of said power element connected to an emitter of said n-p-n transistor and to an emitter of said p-n-p transistor, the emitter of said n-p-n transistor and the emitter of said p-n-p transistor being connected, said driving means providing a driving voltage to said power element, said driving voltage being the only signal provided to said control electrode of said power element;
control means for controlling said driving means, said control means being configured to send a control signal to a base of said n-p-n transistor and to a base of said p-n-p transistor, the base of said n-p-n transistor and the base of said p-n-p transistor being connected, said control signal controlling delivery of said driving voltage to said control electrode of said power element;
abnormality detection means for detecting an occurrence of abnormality in said power element or a load connected to said power element; and
voltage drop control means including,
a constant current circuit for pulling in a current from said control electrode of said power element; and
a switching circuit for stopping an operation by said control means and activating said constant current circuit based on an abnormality detecting signal from said abnormality detection means, whereby said voltage drop control means controls said control means so as to gradually lower said driving voltage of said power element when the occurrence of abnormality in said power element or the load connected to said power element is detected by said abnormality detection means.

20. A power element driving circuit comprising:
driving means for driving an insulated gate bipolar transistor, said driving means includes a circuit wherein a n-p-n and a p-n-p transistor are complementary connected in series, and a gate of said insulated gate bipolar transistor is connected to an emitter of said n-p-n transistor and to an emitter of said p-n-p transistor, the emitter of said n-p-n transistor and the emitter of said p-n-p transistor being connected, said driving means providing a driving voltage to said insulated gate bipolar transistor, said driving voltage being the only signal provided to said gate of said insulated gate bipolar transistor;
control means for controlling said driving means, said control means being configured to output a control signal to a base of said n-p-n transistor and to a base of said p-n-p transistor, the base of said n-p-n transistor and said p-n-p transistor being connected, said control signal controlling delivery of said driving voltage to said gate of said insulated gate bipolar transistor;

abnormality detection means for detecting an occurrence of abnormality in said insulated gate bipolar transistor or in a load connected to said insulated gate bipolar transistor; and voltage drop control means including a constant current circuit for pulling in a current from a said gate of said insulated gate bipolar transistor, and a switching circuit for stopping an operation by said control means and activating said constant current circuit based on an abnormality detecting signal from said abnormality detection means, whereby said voltage drop control means controls said control means to gradually lower said driving voltage of said insulated gate bipolar transistor when the occurrence of abnormality in said insulated gate bipolar transistor or the load is detected by said abnormality detection means.

21. A optically coupled element being an integrated circuit, comprising:

a light emitting element;

a light receiving element for receiving light emitted from said light emitting element;

driving means for driving a power element, said driving means includes a circuit having an n-p-n transistor and a p-n-p transistor which are complementary connected in series, and a control electrode of said power element is connected to an emitter of said n-p-n transistor and to an emitter of said p-n-p transistor, the emitter of said n-p-n transistor and the emitter of said p-n-p transistor being connected, said driving means providing a driving voltage to said power element, said driving voltage being the only signal provided to said control electrode of said power element;

control means for controlling said driving means based on an output from said light receiving element, said control means being configured to send a control signal to a base of said n-p-n transistor and to a base of said p-n-p transistor, the base of said n-p-n transistor and said p-n-p transistor being connected, said control signal controlling delivery of said driving voltage to said control electrode of said power element;

abnormality detection means for detecting an occurrence of abnormality in said power element or a load connected to said power element; and voltage drop control means for controlling said control means so as to gradually lower said driving voltage of said power element when the occurrence of abnormality in said power element or the load is detected by said abnormality detection means, said voltage drop control means including a constant current circuit for pulling in a current from said control electrode of said insulated power element, and a switching circuit for stopping an operation by said control means and activating said constant current circuit based on an abnormality detecting signal from said abnormality detection means, wherein said light emitting element, said light receiving element, said driving means, said control means, said abnormality detection means and said voltage drop control means are formed on a single chip.

22. An optically coupled element being an integrated circuit, comprising:

a light emitting element;

a light receiving element for receiving light emitted from said light emitting element;

driving means for driving an insulated gate bipolar transistor, said driving means includes a circuit wherein a n-p-n and a p-n-p transistor are complementary connected in series, and a gate of said insulated gate bipolar transistor is connected to an emitter of said n-p-n transistor and to an emitter of said p-n-p transistor, the emitter of said n-p-n transistor and the emitter of said p-n-p transistor being connected, said driving means providing a driving voltage to said insulated gate bipolar transistor, said driving voltage being the only signal provided to said gate of said insulated gate bipolar transistor;

first control means for driving said insulated gate bipolar transistor, said first control means being configured to output a control signal to a base of said n-p-n transistor and to a base of said p-n-p transistor, the base of said n-p-n transistor and said p-n-p transistor being connected, said control signal controlling delivery of said driving voltage to said gate of said insulated gate bipolar transistor;

second control means for controlling said driving means based on an output from said light receiving element;

abnormality detection means for detecting an occurrence of abnormality in said insulated gate bipolar transistor or a load connected to said insulated gate bipolar transistor; and voltage drop control means for controlling said first control means so as to gradually lower said driving voltage of said insulated gate bipolar transistor when the occurrence of abnormality in said insulated gate bipolar transistor or the load is detected by said abnormality detection means, said voltage drop control means including a constant current circuit for pulling in a current from said gate of said insulated gate bipolar transistor, and a switching circuit for stopping an operation by said first control means and activating said constant current circuit based on an abnormality detecting signal from said abnormality detection means, wherein said light emitting element, said light receiving element, said driving means, said first and second control means, said abnormality detection means and said voltage drop control means are formed on a single chip.

* * * * *